United States Patent
McLeod

(10) Patent No.: US 7,142,411 B2
(45) Date of Patent: Nov. 28, 2006

(54) METHODS AND APPARATUS FOR DISTRIBUTING POWER IN A COMPUTERIZED DEVICE

(75) Inventor: Gary McLeod, Flaggstaff, AZ (US)

(73) Assignee: Cisco Technology, Inc., San Jose, CA (US)

( * ) Notice: Subject to any disclaimer, the term of this patent is extended or adjusted under 35 U.S.C. 154(b) by 29 days.

(21) Appl. No.: 11/001,879

(22) Filed: Dec. 2, 2004

(65) Prior Publication Data

US 2006/0126278 A1    Jun. 15, 2006

(51) Int. Cl.
*H02B 1/04* (2006.01)

(52) U.S. Cl. ............ 361/624; 361/610; 361/622; 361/643; 361/752; 361/788; 439/843; 174/50; 174/59; 307/38

(58) Field of Classification Search ........ 361/113, 361/610, 622, 624, 600, 601, 611, 637, 640, 361/641, 644, 648, 657, 678, 714–727; 439/843–846, 439/927, 635–637, 707, 708, 713, 465, 687, 439/696, 710, 212, 342, 929, 377; 174/50, 174/59, 68.2; 307/33, 38, 39, 52, 129, 150
See application file for complete search history.

(56) References Cited

U.S. PATENT DOCUMENTS

| | | | |
|---|---|---|---|
| 4,211,460 A | 7/1980 | Seelback et al. ............ 439/338 |
| 6,089,020 A * | 7/2000 | Kawamura ................. 60/618 |
| 6,160,699 A * | 12/2000 | Gibson et al. ............ 361/643 |
| 6,188,567 B1 * | 2/2001 | Borke ..................... 361/622 |
| 6,230,075 B1 * | 5/2001 | Nishijo et al. ............ 700/214 |
| 6,239,975 B1 * | 5/2001 | Otis ...................... 361/727 |
| 6,301,095 B1 * | 10/2001 | Laughlin et al. ........... 361/624 |
| 6,327,157 B1 * | 12/2001 | Mann et al. .............. 361/775 |
| 6,445,571 B1 * | 9/2002 | Inniss et al. ............. 361/624 |
| 6,498,716 B1 * | 12/2002 | Salinas et al. ............ 361/610 |
| 6,545,850 B1 * | 4/2003 | Shearman et al. .......... 361/113 |
| 6,661,671 B1 * | 12/2003 | Franke et al. ............. 361/752 |
| 6,672,914 B1 | 1/2004 | Claprood ................ 439/876 |
| 6,757,748 B1 | 6/2004 | Hipp ...................... 710/2 |
| 6,762,362 B1 | 7/2004 | Cavanaugh et al. ........ 174/68.2 |
| 6,822,876 B1 * | 11/2004 | Goergen .................. 361/788 |
| 6,826,036 B1 * | 11/2004 | Pereira ................... 361/624 |
| 6,882,530 B1 * | 4/2005 | Cyphers et al. ........... 361/686 |
| 6,904,541 B1 * | 6/2005 | MacArthur et al. ......... 714/14 |
| 7,014,516 B1 * | 3/2006 | Yang ..................... 439/845 |

* cited by examiner

*Primary Examiner*—Michael Datskovskiy
(74) *Attorney, Agent, or Firm*—BainwoodHuang

(57) ABSTRACT

In a computerized device requiring a relatively large amount of power during operation (e.g., between approximately 10 kW to 15 kW) at a relatively large current (e.g., between approximately 200 and 300 amperes), an electrical conductor or power distribution assembly having a substantially flat, planar geometry electrically couples a power supply, via bus bars, to a midplane of the computerized device. The substantially flat planar geometry of the power distribution assembly minimizes conduction and radiation of electromagnetic interference (EMI) by the electrical conductor during operation of the computerized device.

19 Claims, 7 Drawing Sheets

METHODS AND APPARATUS FOR DISTRIBUTING POWER IN A COMPUTERIZED DEVICE

BACKGROUND

Certain conventional computerized devices, such as Large Internet Routers or Huge Fabric Routers (HFR's), typically include a signal distribution plane, such as a back plane, that connects to a power source via a bus bar to receive power signals from the power source. The back plane is typically configured as a circuit board, oriented at an end or back portion of a computerized device chassis, that includes jacks or connectors for plug-in cards, such as network cards. The back plane distributes the power signals to the plug-in cards and also provides connectivity among the plug-in cards for exchange of data signals. Large Internet Routers require relatively large amounts of power for operation. For example, certain Large Internet Routers require between 10 kilowatts (kW) and 15 kW of power and between 200 amperes (amps) and 300 amps to operate. Such requirements of the Large Internet Routers create difficulty in managing conducted and radiated electromagnetic interference (EMI) within the Large Internet Routers.

For example, conventional Large Internet Routers have wire connectors that electrically couple the bus bar to the back plane. The wire connectors define a substantially circular cross-section along a length of the connector (e.g., from a first end secured to the bus bar to a second end that couples to the back plane) and carry the relatively large amounts of current from the bus bar to the back plane. The circular cross-sectional geometry of the wire connector, however, combined with the relatively large amount of current carried by the wire connector (e.g., power signals in the range of 10 kW–15 kW at between 200–300 amperes) cause the wire connector to conduct and radiate a magnetic flux field during operation. The magnetic flux field creates EMI within the Large Internet Routers that disrupts the exchange of data signals among the plug-in cards, for example. To minimize the effect of EMI, as conducted and radiated by the wire connector within the Large Internet Routers, manufacturers typically position a relatively large number of power conditioning components, such as capacitors/inductors, torroids, and chokes, within the chassis Large Internet Routers (e.g., oriented in proximity to the wire connector).

Additionally, in conventional computerized devices, the bus bars attach the back plane to redundant power supply units. The redundant power supply units provide fault tolerance to the computerized devices. For example, assume that during operation of a computerized device having a first power supply and a second, redundant power supply, the first power supply fails (e.g., becomes non-operational). In such a case, failure of the first power supply activates the second, redundant power supply such that the second power supply provides power to the computerized device. The use of redundant power supply units within the computerized device provides substantially continuous operation of the computerized device over time.

SUMMARY

Conventional techniques for delivering power signals between a bus bar and a signal distribution plane in a computerized device, such as a Large Internet Router, suffer from a variety of deficiencies.

As described above, conventional computerized devices utilize substantially circular wire connectors that electrically couple a bus bar to a back plane of the computerized devices. The circular cross-sectional geometry of the wire connector and the relatively large amount of current typically carried by the wire connector cause the connector to create electromagnetic interference (EMI) within the computerized device. As a result, manufacturers typically utilize a relatively large number of power conditioning components, such as capacitors/inductors and chokes, within conventional computerized devices to minimize the effect of EMI within the computerized device. The wire connectors, however, require a relatively large number of power conditioning components to minimize EMI radiated and conducted by the wire connector. The power conditioning components occupy a relatively large amount of space within the conventional computerized device between the bus bars and the back plane. As such, the power conditioning components minimize the amount of space available for functional electronic components (e.g., plug-in cards) within the computerized device.

Additionally, in conventional computerized devices, a manufacturer couples the power conditioning components to the chassis of computerized devices using attachment packaging. The because of the relatively large number of components used, the associated attachment packaging also occupies a relatively large amount of space within the chassis of the computerized device. As such, the attachment packaging minimizes the amount of space, within the computerized device, available for functional electronic components (e.g., plug-in cards).

Furthermore, assume a computerized device includes a midplane, rather than a back plane (e.g., where the midplane orients substantially within the center of a chassis of the computerized device). Because of the positioning of the midplane within the chassis of the computerized device, the computerized device typically cannot hold the relatively large number of power conditioning used to minimize EMI radiated and conducted by the wire connector coupling the midplane to the bus bars. As such, in the case where computerized device includes a midplane, a manufacturer cannot effectively minimize EMI radiated and conducted by the wire connector.

Additionally, as described above, conventional computerized devices include redundant power supply units that provide fault tolerance within the device. For example, failure of a first power supply activates a second redundant power supply such that the second power supply provides power to the computerized device, via the bus bars and wire connectors. In the event of failure of one of the power supplies, an operator typically replaces the failed power supply with a functional power supply to maintain power redundancy within the device. To replace the failed power supply, the operator must initially disconnect the bus bar from the back plane. The wire connectors that couple bus bar to back plane, however, are typically formed integral with the bus bar at a first end and couple to the back plane with fasteners, such as bolts, at a second end.

In one approach, prior to decoupling the bus bars from the back plane, the operator powers down the computerized device (e.g., turns the computerized device "off") and disconnects the wire connectors from the back plane of the computerized device. While these steps minimize the risk of electric shock to the operator, by powering down the entire computerized device, the operator prevents operation of the computerized device, thereby decreasing productivity of the computerized device. In another arrangement, the operator disconnects the wire connectors from the back plane of the computerized device while maintaining the operation of the computerized device (e.g., the computerized device remains "on"). While these steps maintain the operation and productivity of the computerized device, by maintaining power within the computerized device, the operator risks receiving a potentially lethal electric shock from the computerized device.

By contrast, embodiments of the present invention significantly overcome the described deficiencies and provide mechanisms and techniques for distributing power in a computerized device. In a computerized device requiring a relatively large amount of power during operation (e.g., between approximately 10 kW to 15 kW) at a relatively large current (e.g., between approximately 200 and 300 amperes), an electrical conductor having a substantially flat, planar geometry electrically couples a power supply, via bus bars, to a midplane of the computerized device. The substantially flat planar geometry of the power distribution assembly minimizes conduction and radiation of electromagnetic interference (EMI) by the electrical conductor during operation of the computerized device.

Additionally, the electrical conductor includes connector ends that detachably couple to the midplane and to the power supply. The detachable connector ends allow a user to electrically and physically decouple a power supply from a midplane. For example assume the computerized device includes redundant power supplies each redundant power supply coupled to the midplane with a corresponding electrical connector. In the case where one of the redundant power supplies fails, the detachable connector ends of the electrical conductor allow a user to electrically and physically decouple failed power supply from the midplane while the redundant, operative power supply provides power to the computerized device. The detachable connector ends, therefore, allows "hot-swapping" of power supplies (e.g., removal of the failed power system while the redundant, operative power supply provides power to the computerized device).

In one arrangement, a power distribution assembly includes a strap having a first end and a second end. The strap has at least one conductive plane extending from the first end of the strap to the second end of the strap where the at least one conductive plane defines a substantially rectangular cross-section along a length of the strap. The power distribution assembly also includes a first connector electrically coupled to the at least one conductive plane at the first end of the strap where the first connector is configured to couple to a bus bar of a computerized device. The power distribution assembly also includes a second connector electrically coupled to the at least one conductive plane at the second end of the strap where the second connector is configured to couple to a midplane of the computerized device. The at least one conductive plane of the strap is configured to provide a conductive pathway between the bus bar and the midplane. The substantially flat planar geometry of the power distribution assembly minimizes conduction and radiation of electromagnetic interference (EMI) by the electrical conductor during operation of the computerized device.

In one arrangement, the at least one conductive plane comprises a first conductive plane and a second conductive plane and wherein the strap comprises an insulator plane disposed between the first conductive plane and the second conductive plane. The insulator plane defining a thickness between approximately 0.004 inches and 0.006 inches, such as a thickness of approximately 0.005 inches. By separating the first and second conductive planes by a distance of approximately 0.004 inches and 0.006 inches, the second insulator plane minimizes the emission of EMI by the power distribution assembly.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the present invention provide mechanisms and techniques for distributing power in a computerized device. In a computerized device requiring a relatively large amount of power during operation (e.g., between approximately 10 kW to 15 kW) at a relatively large current (e.g., between approximately 200 and 300 amperes), an electrical conductor or power distribution assembly having a substantially flat, planar geometry electrically couples a power supply, via bus bars, to a midplane of the computerized device. The substantially flat planar geometry of the power distribution assembly minimizes conduction and radiation of electromagnetic interference (EMI) by the electrical conductor during operation of the computerized device.

Additionally, the power distribution assembly includes connector ends that detachably couple to the midplane and to the power supply. The detachable connector ends allow a user to electrically and physically decouple a power supply from a midplane. For example assume the computerized device includes redundant power supplies each redundant power supply coupled to the midplane with a corresponding electrical connector. In the case where one of the redundant power supplies fails, the detachable connector ends of the power distribution assembly allow a user to electrically and physically decouple failed power supply from the midplane while the redundant, operative power supply provides power to the computerized device. The detachable connector ends, therefore, allows "hot-swapping" of power supplies (e.g., removal of the failed power system while the redundant, operative power supply provides power to the computerized device).

Figure 1:
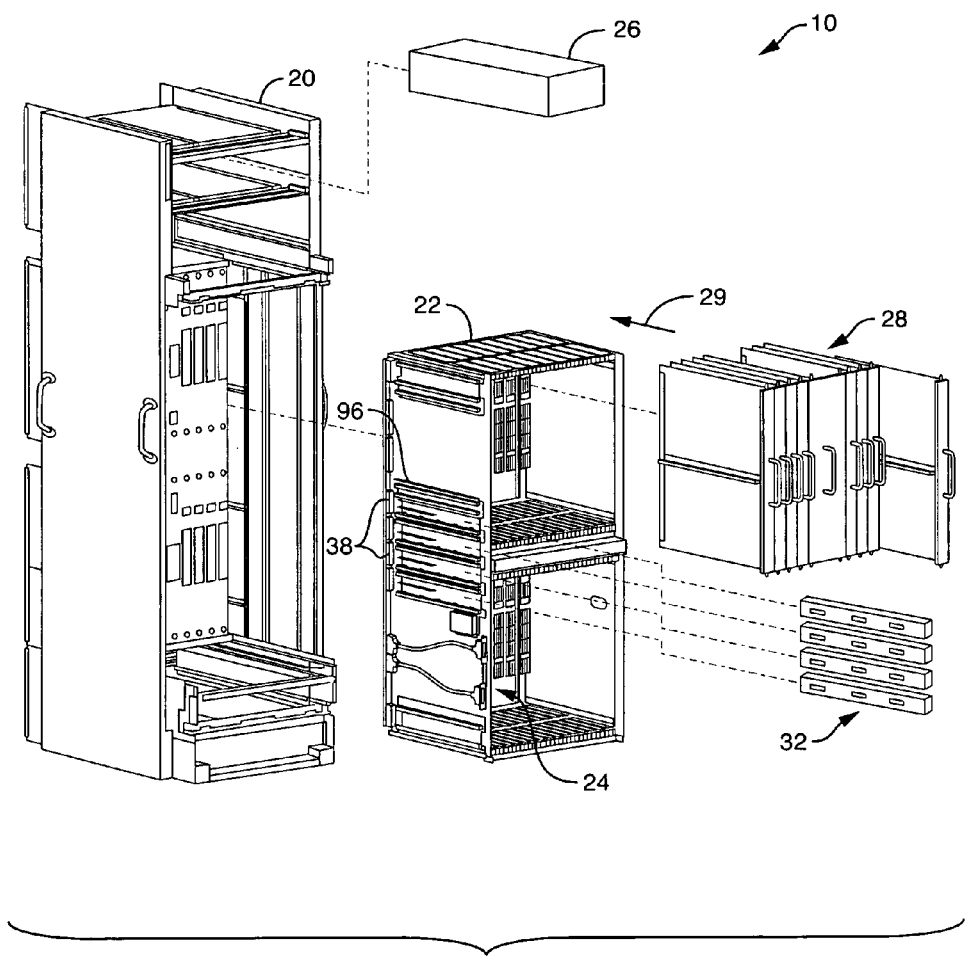
FIG. 1 illustrates an exploded view of a computerized device having a power distribution assembly, according to one embodiment of the invention.
Figure 2:
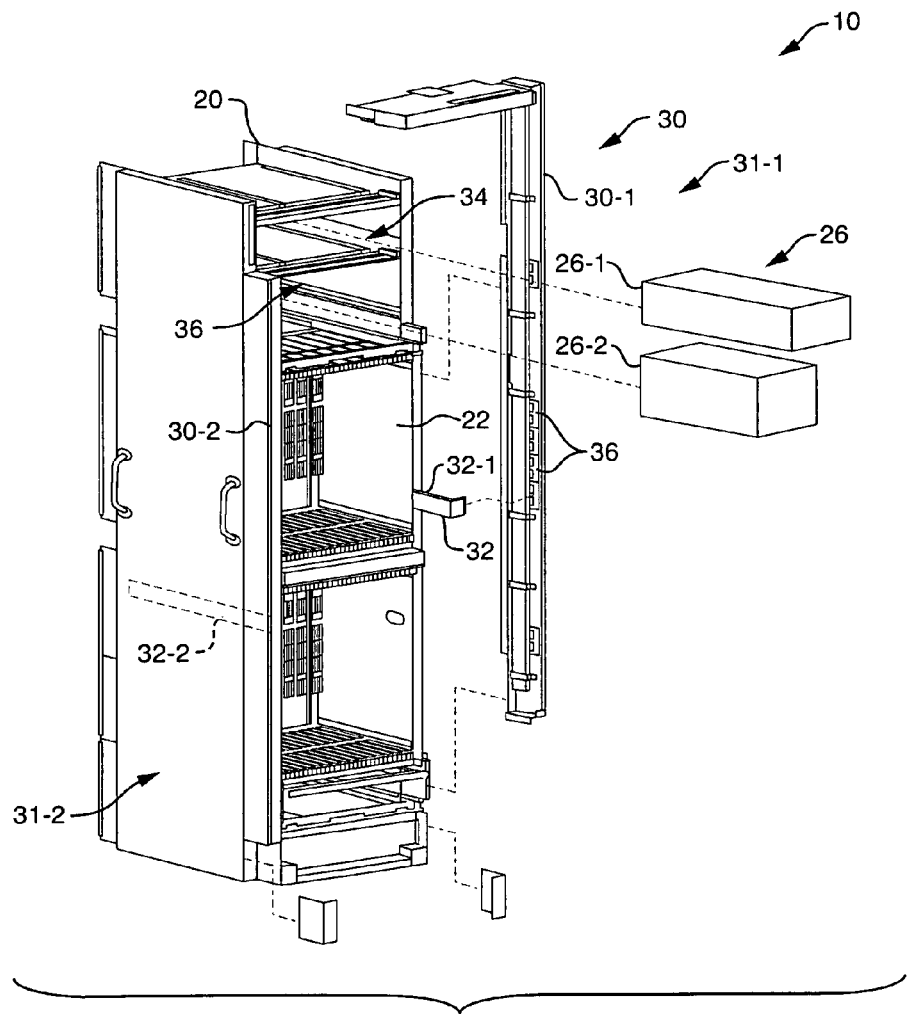
FIG. 2 illustrates a second exploded view of the computerized of FIG. 1, according to one embodiment of the invention.

FIGS. 1 and 2 shows a computerized device 10, such as a Large Internet Router or an HFR. The computerized device 10 includes a chassis 22 that houses a card cage 24, having a midplane 24, and a power source or power supply 26. The computerized device 10 also includes multiple circuit boards or plug-in cards 28 that connect with the midplane 24 when installed in the card cage 22 in the direction 29. The computerized device 10 also includes a bus bar 30 (as illustrated in FIG. 2) in electrically connected to the power supply 26 and a power distribution assembly 32 that electrically couples the bus bar 30 to the midplane 24.

The power supply 26 is configured to deliver power signals to the midplane 24 of the card cage 22 via the bus bar 30 and the power distribution assembly 32. For example, in the case where the computerized device 10 is configured as a Large Internet Router or HFR, the power supply 26 is configured to deliver between approximately 10 kW and 15 kW at between approximately 200 and 300 amps of current.

In one arrangement, as illustrated in FIG. 2, the power supply 26 includes a first power supply 26-1 and a second power supply 26-2. The first power supply 26-1 inserts within a first shelf 32 of the chassis 20 and the second power supply 26-2 inserts within a second shelf 36 of the chassis 20. The first 26-1 and second 26-2 power supplies provide redundancy and fault tolerance within the computerized device 10. For example, assume that during operation, the first power supply 26-1 fails or ceases to operate. Failure of the first power supply 26-1 activates the second (e.g., redundant) power supply 26-2 such that the second power supply 26-2 provides power to the computerized device 10. With redundant power supplies 26-1, 26-2 within the computerized device 10, in the event of failure of one of the power supplies 26-1, 26-1, the midplane 24 continues to receive power, thereby allowing substantially continuous operation of the computerized device 10.

The midplane 24 is configured to receive the power signals from the power source 26 and distribute the power signals to the plug-in cards 28 coupled to the midplane 24. As shown in FIG. 1, the midplane 24 includes midplane connectors 38 that are configured to electrically couple with corresponding power distribution assemblies 32. During operation, the midplane 24 receives power signals from the power source 26 via the electrical communication between a midplane connector 38 and a power distribution assembly 32. Additionally, the midplane 24 is also configured to provide connectivity among the plug-in cars 24 for exchange of data signals during operation.

The bus bar 30 is configured to carry power signals between the power source 26 and the power distribution assembly 32. As indicated in FIG. 2, the bus bar 30 electrically couples to the power supply 26 when connected to the chassis 20. The bus bar 30 also electrically couples to the power distribution assembly 32 via bus bar connectors 36.

In one arrangement, the bus bar 30 includes a first bus bar 30-1 and a second bus bar 30-2. The first bus bar 30-1 attaches to the chassis 20 and electrically couples to the first power supply 26-1 to form a first or primary power system 31-1. The second bus bar 30-2 also attaches to the chassis 20 and electrically couples to the second power supply 26-2 to form a second or backup power system 31-2. The first 30-1 and second 30-2 bus bars provide redundancy and fault tolerance within the computerized device 10. For example, in one arrangement, during operation, the first bus bar 30-1 is configured to deliver power from the first power source 26-1 to the midplane 24. Assume that during operation, the first power supply 26-1 fails or ceases to operate. Failure of the first power supply 26-1 activates the second (e.g., redundant) power supply 26-2 such that the second power supply 26-2 provides power to the computerized device 10 via the second bus bar 30-2.

Figure 4:
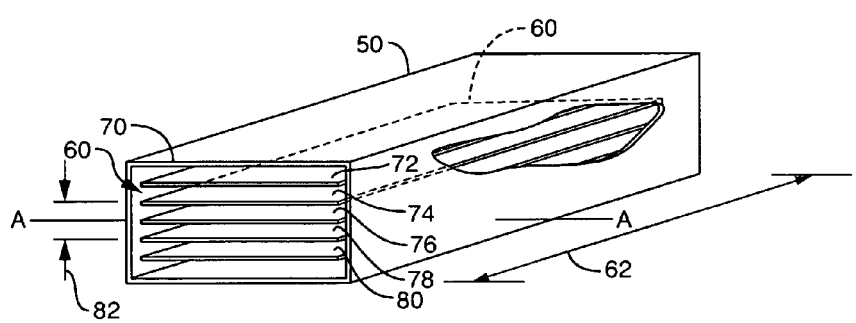
FIG. 4 illustrates a sectional view of the power distribution assembly of FIG. 3, according to one embodiment of the invention.
Figure 5:
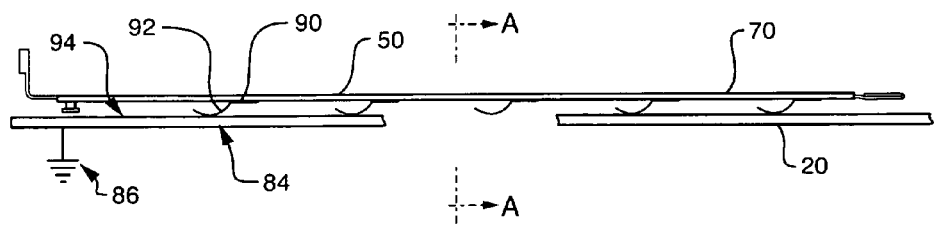
FIG. 5 illustrates a top view of the power distribution assembly of FIG. 3, according to one embodiment of the invention.

The power distribution assembly 32 is configured to electrically couple the bus bar 30 and power supply 26 to the midplane 24 and carry power signals between the bus bar 30 and the midplane 24. Details relating to an example configuration of the power distribution assembly 32 are illustrated in FIGS. 3–5 and described below.

Figure 3:
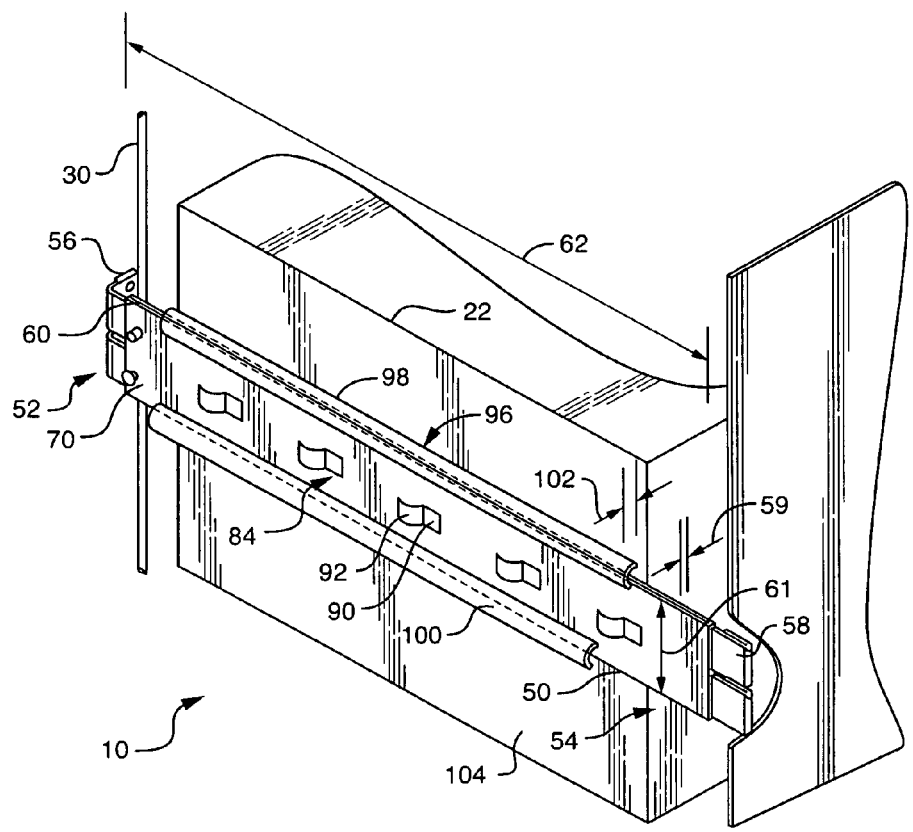
FIG. 3 illustrates a perspective view of the power distribution assembly within the computerized device of FIG. 1, according to one embodiment of the invention.

FIG. 3 illustrates an arrangement of the power distribution assembly 32. The power distribution assembly 32 includes a strap 50 having a first end 52 and a second end 54. The power distribution assembly 32 also includes a first connector 56 coupled to the first end 52 of the strap 50 and a second connector 58 coupled to the second end 54 of the strap 50.

The strap 50 defines a relatively narrow thickness 59. For example, in one arrangement, the strap 50 has a thickness 59 of approximately 0.010 inches, a width 61 of approximately 2.5 inches, and a length 62 of approximately 20 inches. The relatively narrow thickness 59 (e.g., low profile) of the strap 50 allows the power distribution assembly 32 to insert within a relatively narrow space between the card cage 22 and the chassis 20 during assembly. The low profile of the strap occupies a minimal amount of space within the computerized device 10, thereby allowing space for functional electronics within the computerized device 10. The strap 50 includes a conductive plane 60 that extends along a length 62 of the strap 50, from the first end 52 of the strap 50 to the second end 54 of the strap 50. The conductive plane 60 defines a substantially rectangular cross-section along the length 62 of the strap 50. For example, in one arrangement, the conductive plane 60 is configured as a copper sheet contained within the strap 50 that extends between the first end 52 and the second end 54 of the strap 50.

The first connector 56 of the power distribution assembly 32 electrically couples to the conductive plane 60 at the first end 52 of the strap 50. For example, in one arrangement, the conductive plane 60 extends past the length 62 of the strap 50 (e.g., at the first end 52 of the strap 50) and forms the first connector 56 of the strap 50. In such an arrangement, the exposed conductive surface of the conductive plane 60 (e.g., the copper material of the copper sheet) forms the first connector 56 of the power distribution assembly 32. The first connector 56 is configured to couple to the bus bar 30 of the computerized device 10. For example, the first connector 56 mechanically and electrically couples to the bus bar 30 via the bus bar connector 36, as illustrated in FIG. 2.

Returning to FIG. 3, the second connector 58 of the power distribution assembly 32 electrically couples to the conductive plane 60 at the second end 54 of the strap 50. For example, in one arrangement, the conductive plane 60 extends past the length 62 of the strap 50 (e.g., at the second end 54 of the strap 50) and forms the second connector 58 of the strap 50. In such an arrangement, the exposed conductive surface of the conductive plane 60 (e.g., the copper material of the copper sheet) forms the second connector 58 of the power distribution assembly 32. The second connector 58 is configured to couple to the midplane 24 of the computerized device 10. For example, the second connector 58 mechanically and electrically couples to the midplane 24 via the midplane connectors 38, as illustrated in FIG. 1.

The conductive plane 60 of the power distribution assembly 32 is configured to provide a conductive pathway between the bus bar 30 and the midplane 24 during operation of the computerized device 10. For example, the conductive plane 60 carries a power signal between the bus bar 30 (E.g., from the power supply 36) and the midplane 24.

In the case where the computerized device 10 is configured as a Large Internet Router or HFR, the conductive plane 60 carries a relatively large power signal between the bus bar 30 and the midplane 24 at a relatively high current. For example, during operation of the Large Internet Router or HFR, the power supply 26 delivers between approximately 10 kW and 15 kW at between approximately 200 and 300 amperes of current to the midplane 24. The substantially rectangular cross-section of the conductive plane 60 minimizes the relatively large amount of current from inducing EMI within the power distribution assembly 32. The substantially rectangular cross-section of the conductive plane 60 also minimizes the relatively large amount of current from causing the power distribution assembly 32 from conducting EMI within the power distribution assembly 32. As such, the substantially rectangular, cross-section shape of the conductive plane 60 allows a manufacturer to provide a relatively large power signal, having a relatively large current, from a bus bar 30 to a midplane 24 of a computerized device 10, without requiring the use of space-consuming power conditioning components to minimize EMI within the computerized device 10.

As indicated above, the power distribution assembly 32 includes a conductive plane 60 that provide a conductive pathway between the bus bar 30 and the midplane 24 during operation of the computerized device 10. In one arrangement, the power distribution assembly 32 includes multiple conductive planes 60 and insulation layers that minimize the conduction or radiation of EMI by the power distribution assembly 32 during operation.

FIG. 4 illustrates a cross-sectional view of the power distribution assembly 32, as taken along the A—A direction and as shown in FIG. 5. The power distribution assembly 32, in one arrangement, includes an outer layer or outer shell 70 that contains a first insulator plane 72, a first conductive plane 74, a second insulator plane 76, a second conductive plane 78, and a third insulator plane 80.

The outer layer 70, in one arrangement, is formed from a conductive material, such as a cold-rolled steel. The outer layer 70, in part, provides a relative degree of rigidity to the power distribution assembly 32. The outer layer 70 is also configured to couple with a grounding element within the computerized device 10. In addition to holding the conductive and insulator planes of the strap 50 together as an integrated unit, by providing additional grounding to the power distribution assembly 32, the outer layer 70 aids in minimizing EMI conducted by the power distribution assembly 32 (e.g., digital high-speed noise) or radiated by the power distribution assembly 32.

The first 72 and third 80 insulator planes electrically separate (e.g., insulate) the respective first 74 and second 78 conductive planes of the power distribution assembly 32 from the electrically conductive outer layer 70. In one arrangement, the first 72 and third 80 insulator planes are formed from a fiberglass material.

As indicated above, the conductive plane 60 includes the first conductive plane 74 and the second conductive plane 78 having the second insulator plane 76 disposed between the first 74 and second 78 conductive planes. Each of the first 74 and second 78 conductive planes has a substantially rectangular cross-section along the length 62 of the strap 50.

Additionally, the first 74 and second 78 conductive planes orient substantially parallel to each other, as separated by the second insulator plane or layer 76. The configuration of the strap 50 with the first 74 and second 78 conductive planes allows the transmission of signals between the midplane 24 and the bus bar 30 and power supply 26. For example, in one arrangement, the first conductive layer 74 of the strap 50 carries an input signal (e.g., power) from the bus bar 30 to the midplane 24 while the second conductive layer 78 carries an output signal (e.g., forms an output path for the power signal) from the midplane 24 to the bus bar.

The second insulator plane 76 extends along the length 62 of the strap 50 is configured to electrically separate the first conductive plane 74 from the second conductive plane 78. The second insulator plane 76 defines a thickness 82 between approximately 0.004 inches and 0.006 inches, such as a thickness of approximately 0.005 inches. When the second insulator plane 76 orients between the first conductive plane 74 and the second conductive plane 76, the second insulator plane 76, therefore, separates the opposing conductive surfaces of the respective first 74 and second 78 conductive planes by a distance 82 of between approximately 0.004 inches and 0.006 inches. By separating the first 74 and second 78 conductive planes by a distance 82 of approximately 0.004 inches and 0.006 inches, the second insulator plane 76 minimizes the emission of EMI by the power distribution assembly 32. The geometric configuration of the second insulator plane 76, therefore, minimizes the necessity for a manufacturer to use power conditioning components associated with the connector between the bus bar 30 and the midplane 24 to minimize EMI within the computerized device 10.

As indicated above, in one arrangement, the outer layer 70 of the strap is formed from a conductive material, such as a cold-rolled steel. The outer layer 70 couples with a grounding element within the computerized device 10 to minimize EMI conducted radiated by the power distribution assembly 32.

FIGS. 3 and 5 illustrate an arrangement of the power distribution assembly 32 where the power distribution assembly 32 includes grounding components 84 coupled to the outer surface 70 of the strap 50. The grounding components 84 are configured to electrically couple with the chassis 20 of the computerized device 10 to electrically couple the power distribution assembly 32 to a ground location 86 (e.g., the ground location associated with the chassis 20, for example). The grounding components 84, therefore, minimize EMI conducted radiated by the power distribution assembly 32 during operation.

In one arrangement, the grounding components 84 are configured as leaf springs 88 having an attachment portion 90 and a leaf portion 92. During assembly, a manufacturer inserts a power distribution assembly 32 within the computerized device 10 such that the power distribution assembly 32 orients between the card cage 22 and the chassis 20 of the computerized device 10. During insertion, the card cage 22 forces the power distribution assembly 32 toward the chassis 20 such that the power distribution assembly 32 compresses the leaf portion 92 of the leaf spring 84 against a wall 94 the chassis 20. Compression of the leaf spring 84 against the chassis wall 94 allows the power distribution assembly 32 to maintain substantially continuous contact with the chassis ground 86 over time.

As indicated above, and as illustrated in FIG. 1, during assembly a manufacturer inserts a power distribution assembly 32 within the computerized device 10 such that the power distribution assembly 32 orients between the card cage 22 and the chassis 20 of the computerized device 10. In one arrangement, the card cage 33 includes a sleeve 96, oriented between the card cage 22 and the chassis 20, that supports or holds the power distribution assembly 32 within the computerized device 10 along the length 62 of the power distribution assembly 32.

Figure 6:
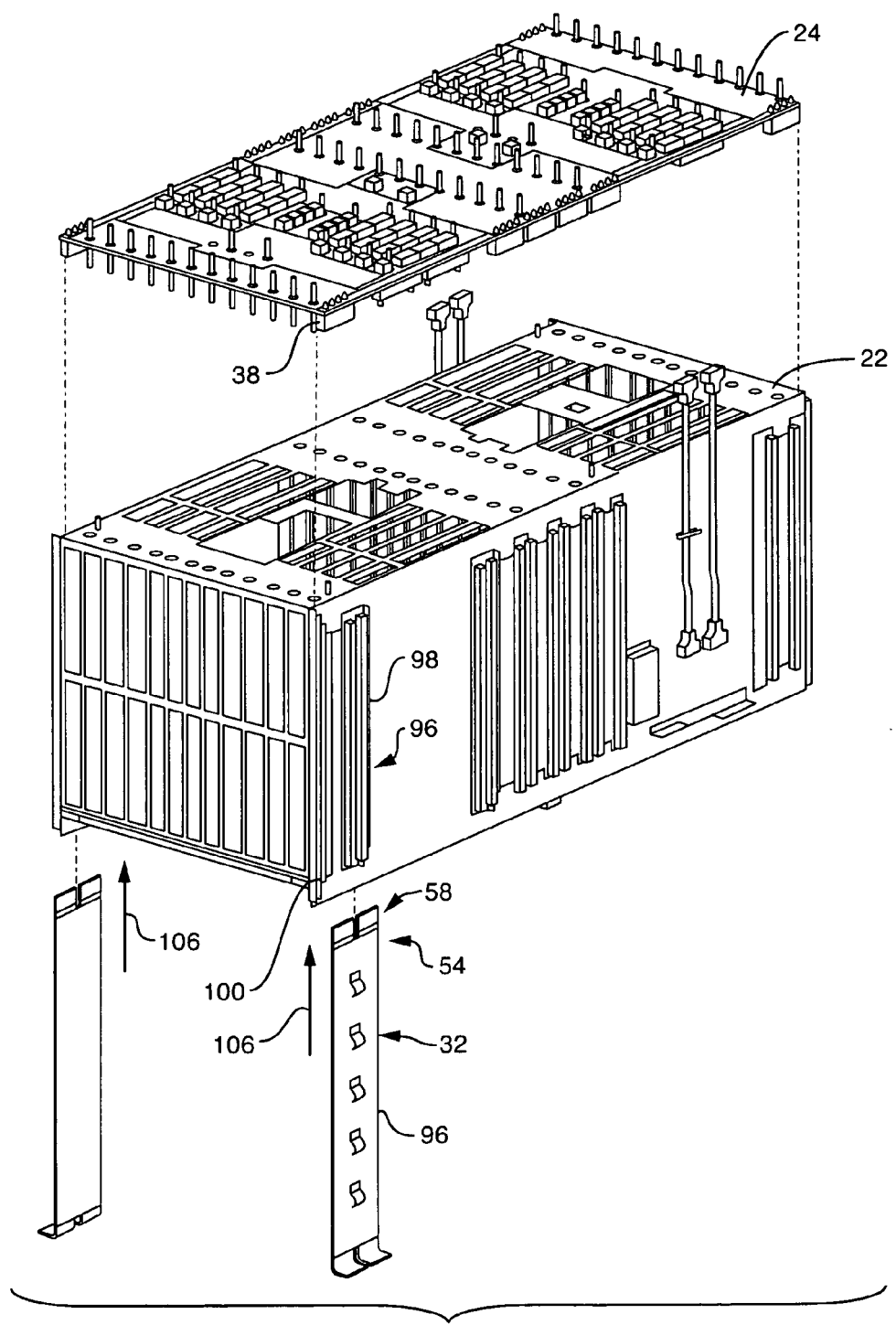
FIG. 6 illustrates an exploded view of a card cage, midplane, and power distribution assembly of FIG. 1, according to one embodiment of the invention.

FIGS. 3 and 6 illustrate a configuration of the sleeve 96 where the sleeve 96 includes a first support member 98 and a second support member 100. The first support member 98 and second support member 100 are configured to align the second end 54 and the second connector 58 of the power distribution assembly 32 with the associated connector 38 of the midplane 24 during installation. For example, as a user inserts the power distribution assembly 32 into a sleeve 96 along direction 106, the sleeve 96 aligns the second end 54 and the second connector 58 with the associated connector 38 of the midplane 24.

In one arrangement, the first support member 98 and second support member 100 are configured to support the strap 50 substantially along the length 62 of the strap 50. Support by the first support member 98 and second support member 100 minimizes bending of the strap 50 along the length 62, and relative to, the corresponding midplane connector 38 and bus bar connector 36. The first support member 98 and second support member 100, therefore, minimize bending stresses, as applied by the first 56 and second 58 connectors of the power distribution assembly 32, on the corresponding bus bar 36 and midplane 36 connectors.

In one arrangement, the sleeve 96 is also configured to minimize EMI conduction and radiation of the power distribution assembly 32. For example, in one arrangement, the first support member 98 and second support member 100 are formed of an electrically conductive material and are electrically coupled to a grounding location (e.g., a grounding location associated with the card cage 22). Each of the first support member 98 and second support member 100 define a gap 102 relative to a wall 104 of the card cage 22. The gap 102 is substantially equal to the thickness 59 of the strap 59. When the power distribution assembly 32 inserts within the sleeve 96, the outer surface 70 (e.g., the electrically conductive outer surface 70) of the strap 50 electrically contacts the first support member 98 and second support member 100. For example, as indicated above, the outer layer 70 of the strap 50, in one arrangement, is formed from an electrically conductive material, such as a cold-rolled steel. Contact between the outer layer 70 of the strap 50 and the sleeve 96 electrically couples the outer layer 70 of the strap 50 to the grounding location associated with the card cage 22. Such grounding aids in minimizing EMI conduction and radiation by the power distribution assembly 32 during operation.

As indicated above, certain computerized devices have multiple, redundant power sources that provide redundancy and fault tolerance within the computerized device. For example, as shown in FIG. 2, the computerized device 10 includes a primary power system 31-1 (e.g., the first bus bar 30-1 electrically coupled to the first power supply 26-1) and a second or backup power system 31-2 (e.g., the second bus bar 30-2 electrically coupled to the second power supply 26-2). Assume that during operation, the first power supply 26-1 fails or ceases to operate. Failure of the first power supply 26-1 activates the second (e.g., redundant) power supply 26-2 such that the second power supply 26-2 provides power to the computerized device 10 via the second bus bar 30-2.

During a power system replacement procedure, to minimize "down time" or deactivation of the computerized device 10, a user removes and replaces the failed power system while the redundant, operative power supply provides power to the computerized device (e.g., in a procedure termed "hot-swapping"). To allow "hot-swapping" of power supplies 26 or power systems 31, the power distribution assembly 32 is configured to detachably couple the bus bars 30 to the midplane 24.

For example, returning to FIGS. 1–3, as indicated above, the power distribution assembly 32 includes a first connector 56 coupled to the first end 52 of the strap 50 and a second connector 58 coupled to the second end 54 of the strap 50. The first connector 56 couples to the bus bar 30 (e.g., to the bus bar connector 36) of the computerized device 10 and the second connector 58 couples to the midplane 24 (e.g., to the midplane connector 38) of the computerized device 10. In one arrangement, the connectors 56, 58 of the power distribution assembly 32 are configured to allow a user to physically and electrically disconnect the midplane 24 from the bus bar 30.

For example, in one arrangement, the second connector 58 is configured to detachably couple to the midplane 24. For example, the second connector 58 is configured as a protrusion that slides into and out of a slot defined by the midplane connector 38. With the second connector 58 detachably coupled to the midplane 24, a user physically and electrically decouples or disconnects the power distribution assembly 32, bus bar 30 and power supply 26 from the computerized device 10. The detachable coupling of the power distribution assembly 32 to the midplane 24 allows a user to remove and replace (e.g., "hot-swap") the power distribution assembly 32, bus bar 30 and power supply 26, relative to the computerized device 10, while the computerized device 10 operates (e.g., while the midplane is "live").

The detachable coupling of the power distribution assembly 32, therefore, minimizes "downtime" of the computerized device 10 when a user replaces a failed power supply 26 or a failed power system 31. Additionally, by electrically decoupling the bus bar 30 and power supply 26 from the midplane 24, the detachable coupling of the power distribution assembly 32 minimizes the user's risk in receiving a potentially lethal electric shock from the computerized device 10 during the hot-swap procedure.

In one arrangement, the first connector 56 is configured to detachably couple to the bus bar 30. For example, the first connector 56 is configured as a protrusion that slides into and out of a slot defined by the bus bar connector 36. With the first connector 56 detachably coupled to the bus bar 30, a user can physically and electrically decouple or disconnect the bus bar 30 and power supply 26 (e.g., the power system 31) from the midplane 24 of the computerized device 10. The detachable coupling of the power distribution assembly 32 to the bus bar 30 allows a user to remove and replace (e.g., "hot-swap") the bus bar 30 and power supply 26, relative to the computerized device 10, while the computerized device 10 operates. The detachable coupling of the power distribution assembly 32, therefore, minimizes "downtime" of the computerized device 10 when a user replaces a failed power supply 26 or a failed power system 31. Additionally, by electrically decoupling the bus bar 30 and power supply 26 from the midplane 24, the detachable coupling of the power distribution assembly 32 minimizes the user's risk in receiving a potentially lethal electric shock from the computerized device 10 during the hot-swap procedure.

Figure 7:
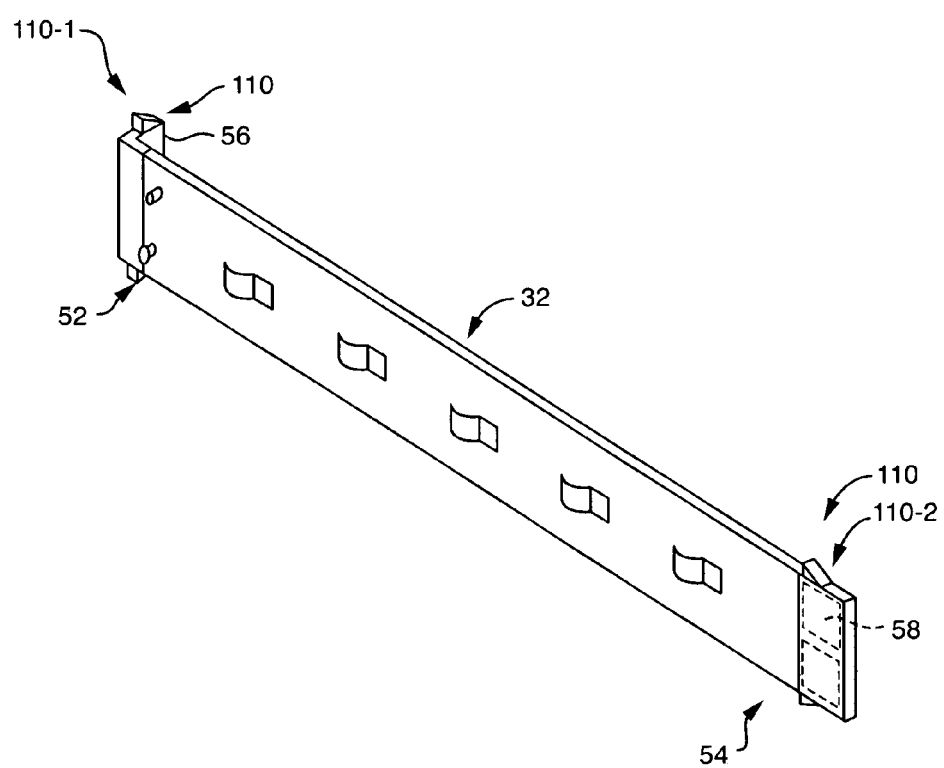
FIG. 7 illustrates a perspective view of the power distribution assembly of FIG. 3, according to one embodiment of the invention.

FIG. 7 illustrates an arrangement of the power distribution assembly 32 where the first connector 56 and the second connector 58 each include an ejection mechanism 110. The ejection mechanism 110, in one arrangement, is configured to physically and electrically decouple the power distribution assembly 32 from the midplane 24 or from the bus bar 30. For example, the first connector 56 includes a first ejection mechanism 110-1. When a user activates the first ejection mechanism 110-1, the first ejection mechanism 110-1 generates a force between the first connector 56 and the midplane connector 38 to physically and electrically separate the power distribution assembly 32 from the midplane 24. In another example, the second connector 58 includes a second ejection mechanism 110-2. When a user activates the second ejection mechanism 110-2, the second ejection mechanism 110-2 generates a force between the second connector 58 and the bus bar connector 36 to physically and electrically separate the power distribution assembly 32 from the bus bar 30.

The ejection mechanism 110 of the power distribution assembly 32 allows a user to detach the bus bar 30 from the midplane 24 during a "hot-swap" procedure while minimizing the need for the user to physically contact the operational (e.g., electrically live) midplane 24 to separate the bus bar 30 from the midplane 24. The ejection mechanism 110 minimizes the user's exposure to potentially lethal current carried by the midplane 24 when separating the power system 31 (e.g., bus bar 30 and power supply 26) from the computerized device 10 during a "hot-swap" procedure.

Figure 8:
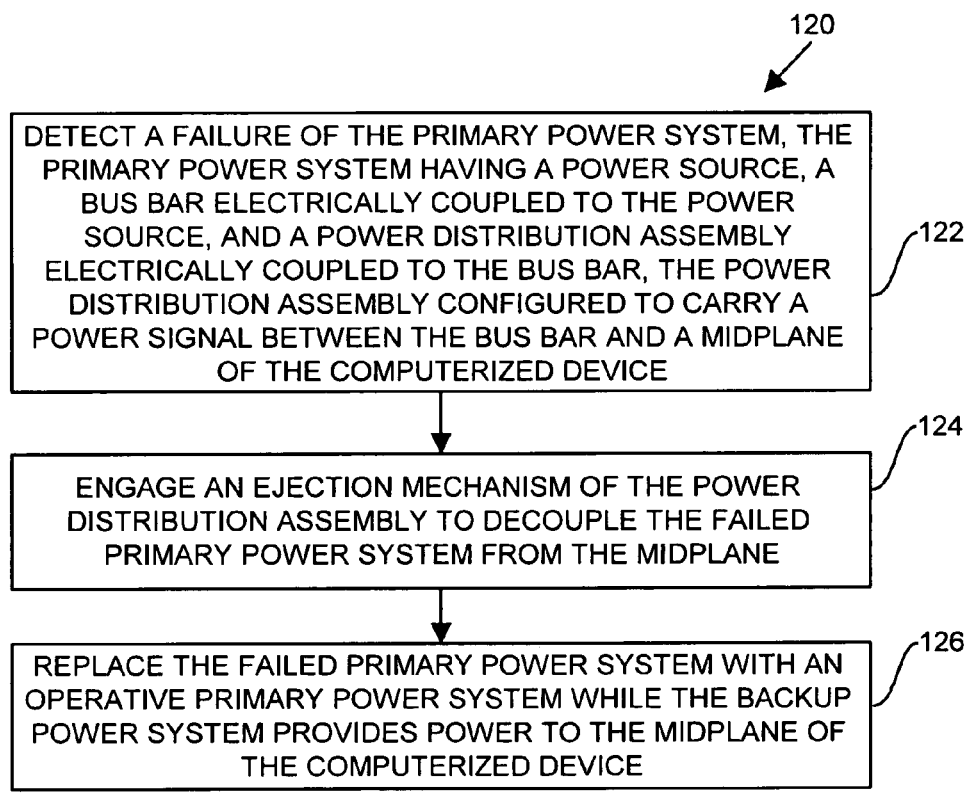
FIG. 8 illustrates a flowchart of procedure for replacing a failed power system in the computerized device of FIG. 1, according to one embodiment of the invention.

FIG. 8 illustrates a method 120 for replacing a failed power system in the computerized device 10, as illustrated in FIGS. 1 and 2, according to one arrangement. A technician or user at an on-site location can perform the method, for example (e.g., at the physical location of the computerized device).

In step 122, the user detects a failure of the primary power system 31-1, the primary power system 31-1 having a power source 26-1, a bus bar 30-1 electrically coupled to the power source 26-1, and a power distribution assembly 32-1 electrically coupled to the bus bar 30-1, the power distribution assembly 32-1 configured to carry a power signal between the bus bar 30-3 and a midplane 24 of the computerized device 10. For example, when an element of the primary power system 31-1 fails, such as the primary power source 26-1, computerized device 10 provides a visual (e.g., flashing LED), audio (e.g., auditory alarm), or electronic indicator (e.g., electronic message) to the user that indicates such a failure.

In step 124, the user engages an ejection mechanism 110 of the power distribution assembly 32 to decouple the failed primary power system 26-1 from the midplane 24. The ejection mechanism 110 of the power distribution assembly 32 allows a user to detach the bus bar 30 from the midplane 24 during a "hot-swap" procedure while minimizing the need for the user to physically contact the operational (e.g., electrically live) midplane 24 to separate the bus bar 30 from the midplane 24. As such, the ejection mechanism 110 minimizes the user's risk of electrocution.

In step 126, the user replaces the failed primary power system 26-1 with an operative primary power system while the backup power system 32-2 provides power to the midplane 24 of the computerized device 10. For example, when replacing the failed primary power system 26-1, the user removes the failed primary power system 26-1 from the computerized device 10 and couples an operative primary power system to the midplane 24 of the computerized device 10. Such replacement or "hot-swapping" of a failed power system 31 while the computerized device 10 continues to operate limits downtime of the computerized device 10.

While this invention has been particularly shown and described with references to preferred embodiments thereof, it will be understood by those skilled in the art that various changes in form and details may be made therein without departing from the spirit and scope of the invention as defined by the appended claims.

For example, as indicated above, the conductive plane 60 extends past the length 62 of the strap 50 (e.g., at the first end 52 of the strap 50 and at the second end 54 of the strap 50) and forms the first connector 56 and the second connector 58 of the strap 50. In such an arrangement, the exposed conductive surface of the conductive plane 60 (e.g., the copper material of the copper sheet) forms the first connector 56 and the second connector 58 of the power distribution assembly 32. In one arrangement, at each end 52, 54 of the strap 50, the conductive plane 60 folds onto itself, as shown in FIG. 3, to form the first connector 56 and the second connector 58. Such folding provides rigidity to the connectors 56, 58 and minimizes collapse or bending of the connectors 56, 58 as a user inserts the connectors 56, 58 within the bus bar connector 36 or a midplane connector 38, respectively.

What is claimed is:

1. A power distribution assembly comprising:
   a strap having a first end and a second end, the strap having at least one conductive plane extending from the first end of the strap to the second end of the strap, the at least one conductive plane defining a substantially rectangular cross-section along a length of the strap;
   a first connector electrically coupled to the at least one conductive plane at the first end of the strap, the first connector configured to couple to a bus bar of a computerized device; and
   a second connector electrically coupled to the at least one conductive plane at the second end of the strap, the second connector configured to couple to a midplane of the computerized device, the at least one conductive plane of the strap configured to provide a conductive pathway between the bus bar and the midplane;
   wherein the first connector comprises an ejection mechanism configured to decouple the first end of the power distribution assembly from the bus bar.

2. The power distribution assembly of claim 1 wherein the at least one conductive plane comprises a first conductive plane and a second conductive plane and wherein the strap comprises an insulator plane disposed between the first conductive plane and the second conductive plane, the insulator plane defining a thickness between approximately 0.004 inches and 0.006 inches.

3. The power distribution assembly of claim 2 wherein the insulator plane defines a thickness of approximately 0.005 inches.

4. A power distribution assembly comprising:
   a strap having a first end and a second end, the strap having at least one conductive plane extending from the first end of the strap to the second end of the strap, the at least one conductive plane defining a substantially rectangular cross-section along a length of the strap;
   a first connector electrically coupled to the at least one conductive plane at the first end of the strap, the first connector configured to couple to a bus bar of a computerized device; and
   a second connector electrically coupled to the at least one conductive plane at the second end of the strap, the second connector configured to couple to a midplane of the computerized device, the at least one conductive plane of the strap configured to provide a conductive pathway between the bus bar and the midplane;

wherein the second connector comprises an ejection mechanism configured to decouple the second end of the power distribution assembly from the midplane.

5. A power distribution assembly comprising:
a strap having a first end and a second end, the strap having at least one conductive plane extending from the first end of the strap to the second end of the strap, the at least one conductive plane defining a substantially rectangular cross-section along a length of the strap;
a first connector electrically coupled to the at least one conductive plane at the first end of the strap, the first connector configured to couple to a bus bar of a computerized device; and
a second connector electrically coupled to the at least one conductive plane at the second end of the strap, the second connector configured to couple to a midplane of the computerized device, the at least one conductive plane of the strap configured to provide a conductive pathway between the bus bar and the midplane;
wherein the strap defines an outer surface, the strap having a grounding component coupled to the outer surface of the strap, the grounding component configured to electrically couple with a chassis of the computerized device.

6. The power distribution assembly of claim 5 wherein the grounding component comprises a leaf spring.

7. A computerized device comprising:
a chassis;
a midplane coupled to the chassis;
a bus bar coupled to the chassis and electrically coupled to a power source; and
a power distribution assembly coupled to the chassis, the power distribution assembly having:
a strap having a first end and a second end, the strap having at least one conductive plane extending from the first end of the strap to the second end of the strap, the at least one conductive plane defining a substantially rectangular cross-section along a length of the strap;
a first connector electrically coupled to the at least one conductive plane at the first end of the strap, the first connector coupled to the bus bar of the computerized device; and
a second connector electrically coupled to the at least one conductive plane at the second end of the strap, the second connector coupled to the midplane of the computerized device, the at least one conductive plane of the strap configured to carry a power signal between the bus bar and the midplane;
wherein the first connector comprises an ejection mechanism configured to decouple the first end of the power distribution assembly from the bus bar.

8. The computerized device of claim 7 wherein the at least one conductive plane of the strap comprises a first conductive plane and a second conductive plane and wherein the strap comprises an insulator plane disposed between the first conductive plane and the second conductive plane, the insulator plane defining a thickness between approximately 0.004 inches and 0.006 inches.

9. The computerized device of claim 8 wherein the insulator plane defines a thickness of approximately 0.005 inches.

10. The computerized device of claim 7, wherein:
the strap defines a long axis substantially perpendicular to a long axis of the bus bar;
the first connector extends along a direction substantially perpendicular to the long axis of the strap and substantially parallel to a coupling surface of the midplane; and
the second connector extends along a direction substantially parallel to the long axis of the strap and substantially perpendicular to the coupling surface of the midplane.

11. A computerized device comprising:
a chassis;
a midplane coupled to the chassis;
a bus bar coupled to the chassis and electrically coupled to a power source; and
a power distribution assembly coupled to the chassis, the power distribution assembly having:
a strap having a first end and a second end, the strap having at least one conductive plane extending from the first end of the strap to the second end of the strap, the at least one conductive plane defining a substantially rectangular cross-section along a length of the strap;
a first connector electrically coupled to the at least one conductive plane at the first end of the strap, the first connector coupled to the bus bar of the computerized device; and
a second connector electrically coupled to the at least one conductive plane at the second end of the strap, the second connector coupled to the midplane of the computerized device, the at least one conductive plane of the strap configured to carry a power signal between the bus bar and the midplane;
wherein the second connector comprises an ejection mechanism configured to decouple the second end of the power distribution assembly from the midplane.

12. The computerized device of claim 11, wherein
the strap defines a long axis substantially perpendicular to a long axis of the bus bar;
the first connector extends along a direction substantially perpendicular to the long axis of the strap and substantially parallel to a coupling surface of the midplane; and
the second connector extends along a direction substantially parallel to the long axis of the strap and substantially perpendicular to the coupling surface of the midplane.

13. A computerized device comprising:
a chassis;
a midplane coupled to the chassis;
a bus bar coupled to the chassis and electrically coupled to a power source; and
a power distribution assembly coupled to the chassis, the power distribution assembly having:
a strap having a first end and a second end, the strap having at least one conductive plane extending from the first end of the strap to the second end of the strap, the at least one conductive plane defining a substantially rectangular cross-section alone a length of the strap;
a first connector electrically coupled to the at least one conductive plane at the first end of the strap, the first connector coupled to the bus bar of the computerized device; and
a second connector electrically coupled to the at least one conductive plane at the second end of the strap, the second connector coupled to the midplane of the computerized device, the at least one conductive plane of the strap configured to carry a power signal between the bus bar and the mid plane;

wherein the strap defines an outer surface, the strap having a grounding component coupled to the outer surface of the strap, the grounding component configured to electrically couple with a chassis of the computerized device.

14. The computerized device of claim 13 wherein the grounding component comprises a leaf spring.

15. The computerized device of claim 13 wherein the chassis comprises a sleeve, the strap of the power distribution assembly configured to insert within the sleeve.

16. The computerized device of claim 13, wherein
the strap defines a long axis substantially perpendicular to a long axis of the bus bar;
the first connector extends along a direction substantially perpendicular to the long axis of the strap and substantially parallel to a coupling surface of the midplane; and
the second connector extends along a direction substantially parallel to the long axis of the strap and substantially perpendicular to the coupling surface of the midplane.

17. In a computerized device having a primary power system and a backup power system, a method for replacing the primary power system during operation of the backup power system comprising:
detecting a failure of the primary power system, the primary power system having a power source, a bus bar electrically coupled to the power source, and a power distribution assembly electrically coupled to the bus bar, the power distribution assembly configured to carry a power signal between the bus bar and a midplane of the computerized device;
engaging an ejection mechanism of the power distribution assembly to decouple the failed primary power system from the midplane; and replacing the failed primary power system with an operative primary power system while the backup power system provides power to the midplane of the computerized device.

18. The method of claim 17 wherein detecting comprises detecting a failure of the primary power system, the primary power system having a power source, a bus bar electrically coupled to the power source, and a power distribution assembly electrically coupled to the bus bar, the power distribution assembly having at least one conductive plane extending from a first end to a second end of the power distribution assembly, the at least one conductive plane defining a substantially rectangular cross-section along a length of the power distribution assembly, the power distribution assembly configured to carry a power signal between the bus bar and a midplane of the computerized system.

19. The method of claim 17 wherein replacing comprises: removing the failed primary power system from the computerized device; and coupling an operative primary power system to the midplane of the computerized device while the backup power system provides power to the midplane of the computerized device.

* * * * *